US009379481B2

(12) United States Patent
Kashiwada et al.

(10) Patent No.: US 9,379,481 B2
(45) Date of Patent: Jun. 28, 2016

(54) SERVICE COVER

(71) Applicant: Sumitomo Wiring Systems, Ltd., Yokkaichi, Mie (JP)

(72) Inventors: Tomokazu Kashiwada, Mie (JP); Masafumi Uno, Mie (JP); Kiyotaka Itsuki, Mie (JP)

(73) Assignee: SUMITOMO WIRING SYSTEMS, LTD. (JP)

( * ) Notice: Subject to any disclaimer, the term of this patent is extended or adjusted under 35 U.S.C. 154(b) by 0 days.

(21) Appl. No.: 14/612,368

(22) Filed: Feb. 3, 2015

(65) Prior Publication Data

US 2015/0244103 A1 Aug. 27, 2015

(30) Foreign Application Priority Data

Feb. 26, 2014 (JP) ................................ 2014-035103

(51) Int. Cl.

*H01R 13/52* (2006.01)
*H05K 5/00* (2006.01)
*H01R 13/502* (2006.01)
*H01R 43/00* (2006.01)

(52) U.S. Cl.

CPC .......... *H01R 13/5219* (2013.01); *H01R 13/502* (2013.01); *H01R 13/5213* (2013.01); *H01R 43/005* (2013.01)

(58) Field of Classification Search

CPC .. H01R 13/5219; H01R 13/521; H01R 13/52; H01R 13/5202; H01R 13/5213; H02G 3/10
USPC ........... 439/271, 272; 174/66, 50.5, 520, 521, 174/527
See application file for complete search history.

(56) References Cited

U.S. PATENT DOCUMENTS 5,835,981 A * 11/1998 Smith .................. H02G 15/117 174/82
6,814,599 B2 * 11/2004 Sakiyama .......... H01R 13/5219 439/271
2010/0255728 A1 * 10/2010 Matsuoka .............. H01R 4/302 439/607.55
2011/0100704 A1 * 5/2011 Iida ..................... B60R 16/0239 174/520
2012/0164850 A1 * 6/2012 Kobayashi ........... G01N 27/409 439/55
2014/0127920 A1 5/2014 Tamaka et al.

* cited by examiner

*Primary Examiner* — Briggitte R Hammond
(74) *Attorney, Agent, or Firm* — Gerald E. Hespos; Michael J. Porco; Matthew T. Hespos

(57) ABSTRACT

A service cover (50) to be mounted to close a rear end opening (25) provided on a housing main body (21) of a waterproof connector (10) includes a fitting (52) which is fittable into the rear end opening (52), an annular seal ring (80) that provides watertightness between the rear end opening (25) and the fitting (52) and a fitting recess (54) that is recessed on an outer periphery surface of the fitting (52) and into which the seal ring (80) is to be fit. The fitting recess (54) is formed by mounting a front member (70) with a larger cross-section than a cross-sectionally small portion (58) constituting a front end part of the fitting (52) on the cross-sectionally small portion (58).

6 Claims, 7 Drawing Sheets

SERVICE COVER

BACKGROUND

1. Field of the Invention

The present invention relates to a service cover.

2. Description of the Related Art

U.S. Patent Application Publication No. 2014/0127920 discloses a connector with a housing that has an opening and a cover to be mounted over the opening. The cover includes a main body that can fit into the opening and an annular packing is fit on the outer peripheral surface of the main body for providing watertightness between the inner peripheral surface of the opening and the outer peripheral surface of the main body. The packing is retained so as not to come off from the main body by being fit into a groove recessed over the entire periphery on the outer peripheral surface of the housing.

The above-described groove is formed while molding the main body from resin and requires a mold that is opened in a radial direction. However, a groove formed by opening the mold in the radial direction leaves a parting line of the mold across the groove and sealing performance of a seal may be reduced by burrs produced along the parting line. Further, processing work to remove the burrs is necessary to ensure sealing performance of the seal.

The invention was completed based on the above situation and aims to ensure sealing performance of a seal without requiring processing work after molding.

SUMMARY OF THE INVENTION

The invention relates to a service cover for closing an opening provided on a case or box body. The service cover has a fitting that can fit into the opening, an annular seal that provides watertightness between the opening and the fitting, and a fitting recess that is recessed on an outer peripheral surface of the fitting for receiving the seal. The fitting recess is formed by mounting a cross-sectionally large front member on a cross-sectionally small front part of the fitting in a fitting direction. Thus the components that form the groove can be formed without forming a parting line in the groove.

The front member may include at least one retaining portion constituting a front wall of the fitting recess by having the cross-sectionally small portion fit therein and configured to lock at least one locking piece extending forward from the cross-sectionally small portion in a front-back direction. Thus, the front member can be fixed with respect to the fitting while reducing a length of the front member in the front-back direction, as compared with a case where a lock to be locked to the locking piece of the cross-sectionally small portion is provided separately either before or after the retaining portion.

The retaining portion may include at least one guide that guides and positions the locking piece. Thus, the locking piece and the retaining portion can be locked reliably to each other.

The locking piece may be resiliently displaceable toward an inner side of the cross-sectionally small portion. Additionally, at least one protection wall may be formed on a front surface of the retaining portion to cover an outer side of the locking piece. Thus, the locking piece locked to the retaining portion is protected and is not likely to be broken or unlocked inadvertently from the retaining portion due to contact of another member with the locking piece.

The invention also relates to a connector assembly comprising a connector and the above described service cover mounted to close an opening on a case body of the connector.

According to the above, it is possible to ensure sealing of a seal without processing work after molding.

These and other objects, features and advantages of the invention will become more apparent upon reading the following detailed description of preferred embodiments and accompanying drawings.

DETAILED DESCRIPTION

A fluid- or waterproof connector in accordance with an embodiment of the invention is identified by the numeral 10 in FIGS. 1 to 8 and is to be mounted into a mounting hole on a case of a device, such as an inverter installed in a vehicle.

Figure 1:
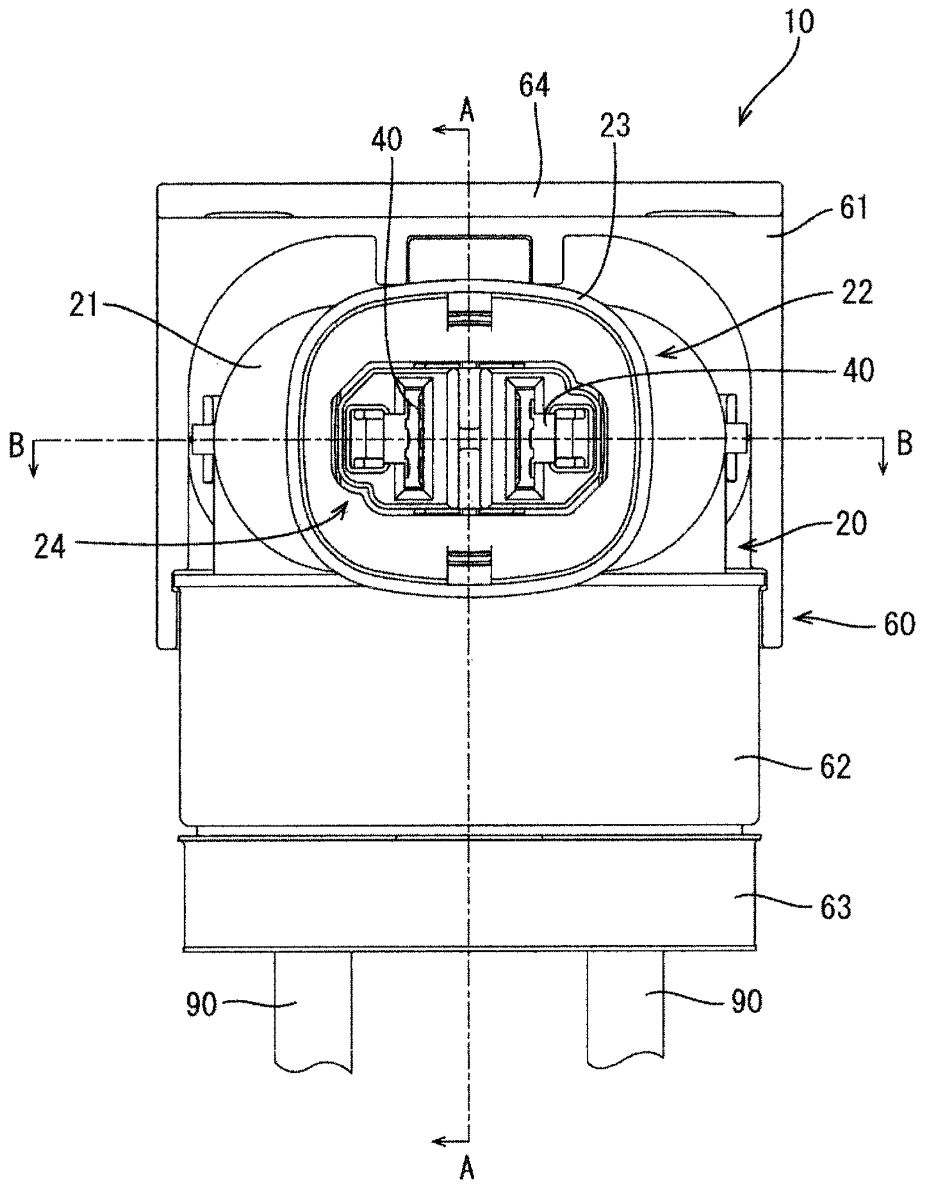
FIG. 1 is a front view of a waterproof connector with a service cover.
Figure 2:
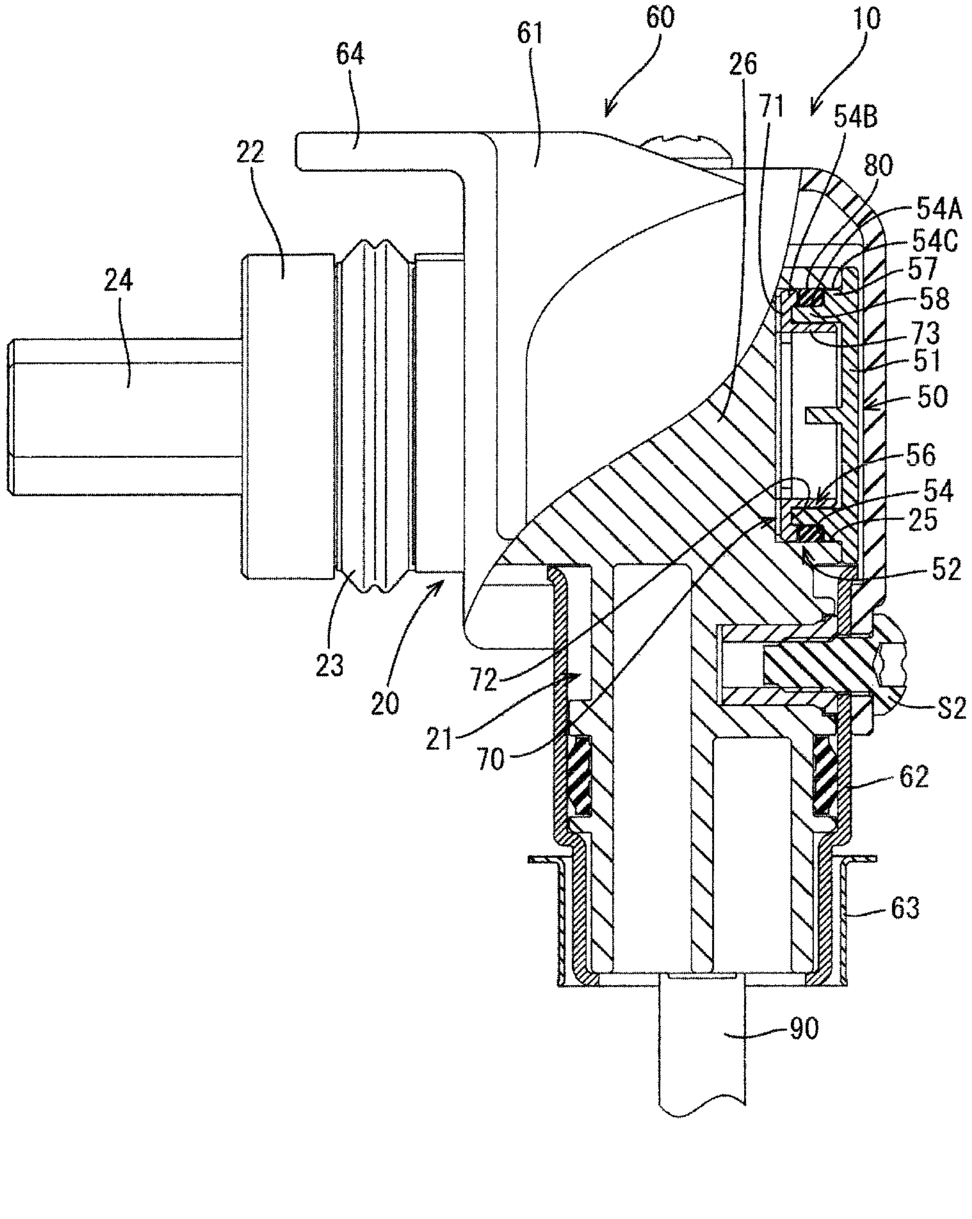
FIG. 2 is a side view partly in section along A-A of FIG. 1.
Figure 3:
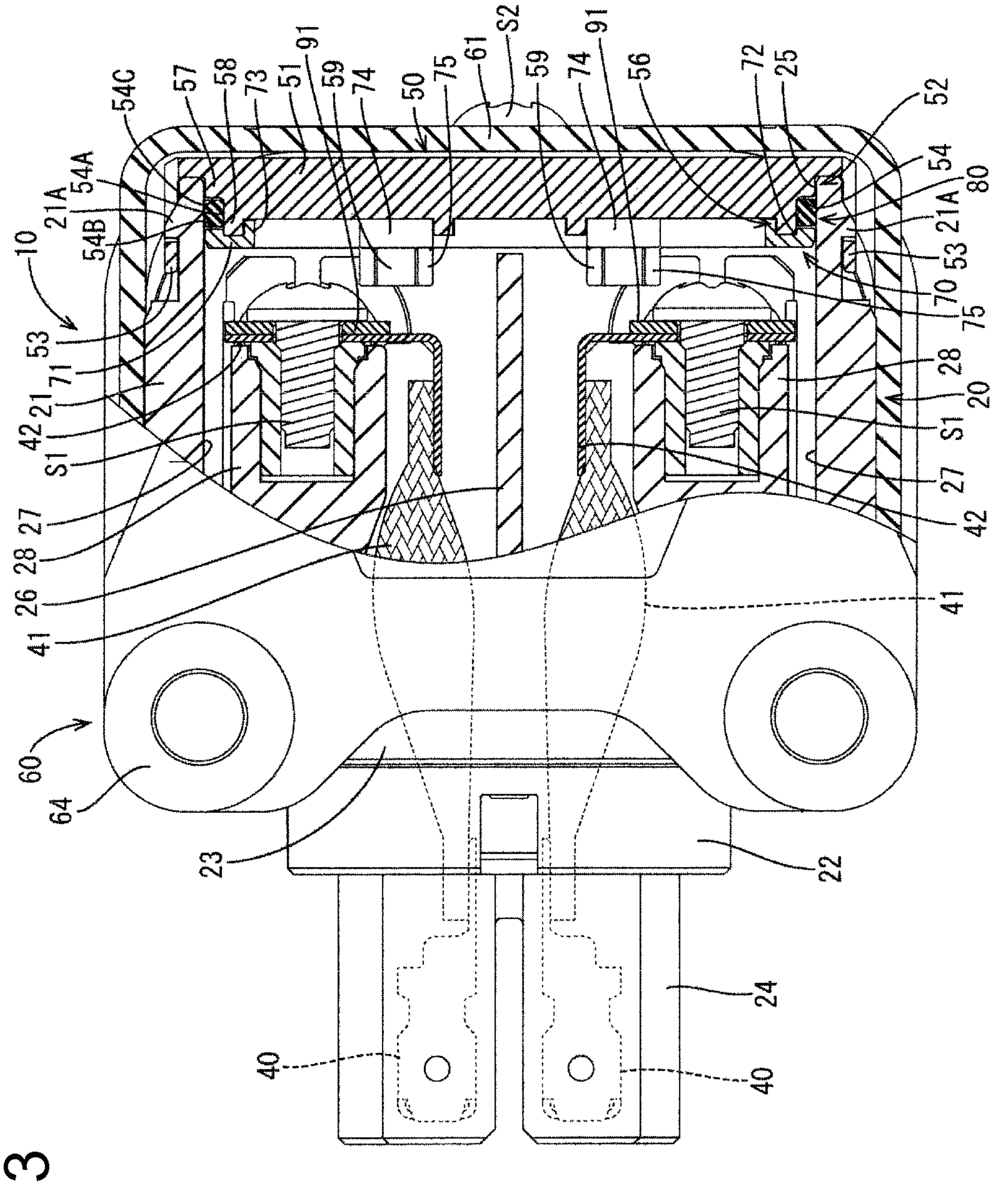
FIG. 3 is a top view partly in section along B-B of FIG. 1.

The waterproof connector 10 includes a housing 20 that can fit into the mounting hole, female terminals 40 to be accommodated in the housing 20, a service cover 50 to be mounted on the housing 20 and a shield shell 60 made of metal and configured to cover a rear part of the housing 20, as shown in FIGS. 2 and 3.

The housing 20 has a block-like main body 21 and a tubular case fitting 22 is on the front end surface of the main body 21. The case fitting 22 can fit into the mounting hole of the case. An annular rubber ring 23 is fit on the outer peripheral surface of the case fitting 22 and provides watertightness between the inner peripheral surface of the mounting hole and the outer peripheral surface of the case fitting 22 when the case fitting 22 is fit into the mounting hole.

A terminal accommodating portion 24 projects forward from the front of the case fitting 22 and two female terminals 40 are accommodated side by side in the terminal accommodating portion 24. The terminal accommodating portion 24 is fit to an unillustrated device connector in the case when the case fitting 22 is fit in the mounting hole so that the female terminals 40 and unillustrated male terminals in the device connector are connected electrically.

A shield layer and preferably a braided conductor 41 is compressed in a front-back direction and connected to each female terminal 40, as shown in FIG. 3. Each braided conductor 41 is introduced into the housing main body 21 from the front through the case fitting 22. An L-shaped terminal 42 is connected to an end of the braided conductor 41 introduced into the main body 21. The L-shaped terminal 42 is bent toward a widthwise outer side after extending back from an end part of the braided conductor 41, and a fixing screw S1 is insertable through a part extending in the width direction.

As shown in FIGS. 2 and 3, the upper rear end of the housing main body 21 includes a rear opening 25 that is open rearward at. Two accommodating chambers 27 are provided side by side in the width direction in the housing main body 21 and are partitioned in the width direction by a partition wall 26. A terminal fixing base 28 is provided in each accommodating chamber 27 and faces outside through the rear end opening 25.

A wire 90 is introduced into each accommodating chamber 27 from below the main body 21. An intermediate terminal 91 is connected to an end of the wire 90 introduced into the accommodating chamber 27 and is arranged with the L-shaped terminal 42 on the rear surface of the terminal fitting base 28 together. A fixing screw S1 then is inserted successively through the intermediate terminal 91 and the L-shaped terminal 42, as shown in FIG. 3. A tool (not shown) then is inserted through the rear end opening of the housing main body 21 to tighten the fixing screw S1 into the terminal fitting base 28. Thus, the intermediate terminal 91 and the L-shaped terminal 42 are connected electrically.

As shown in FIGS. 2 and 3, the service cover 50 closes the rear end opening 25 of the main body 21 after the fixing screws S1 are tightened.

The service cover 50 includes a lid body 51 in the form of a wide elliptical plate and a fitting 52 that fits into the rear end opening 25, as shown in FIGS. 2 to 7. The lid body 51 is configured to close the rear end opening 25 of the housing main body 21 from behind and the fitting 52 projects forward from the front surface of the lid body 51.

Substantially rectangular locking frames 53 are provided on opposite widthwise ends of the lid body 51 and are lockable to locks 21A projecting on opposite widthwise sides of the housing main body 21, as shown in FIG. 3. The locking frames 53 displace laterally out and move over the locks 21A when the fitting 52 is fit into the rear end opening 25. The locking frames 53 then return resiliently to engage the locks 21A in the front-back direction and to fix the service cover 50 on the housing main body 21 with the lid body 51 closing the rear end opening 25.

Figure 4:
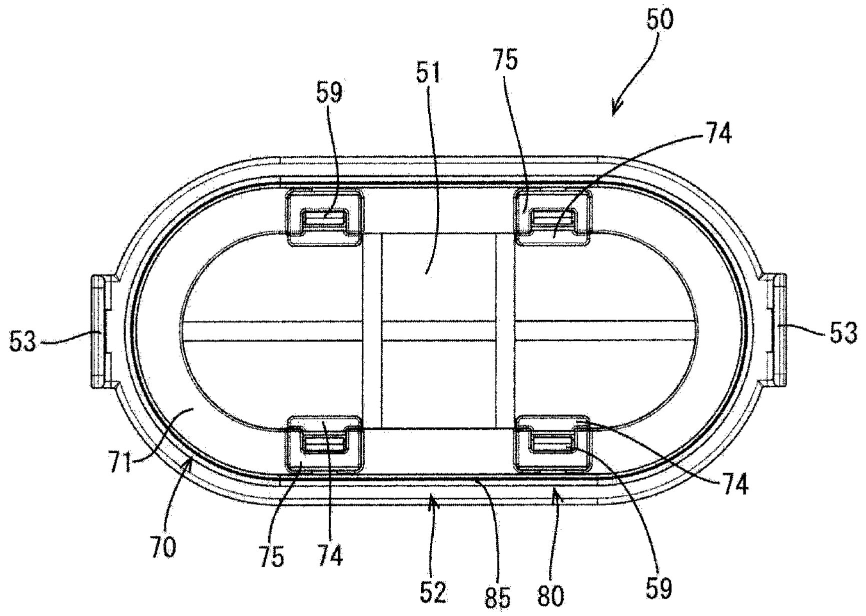
FIG. 4 is a front view of the service cover.
Figure 5:
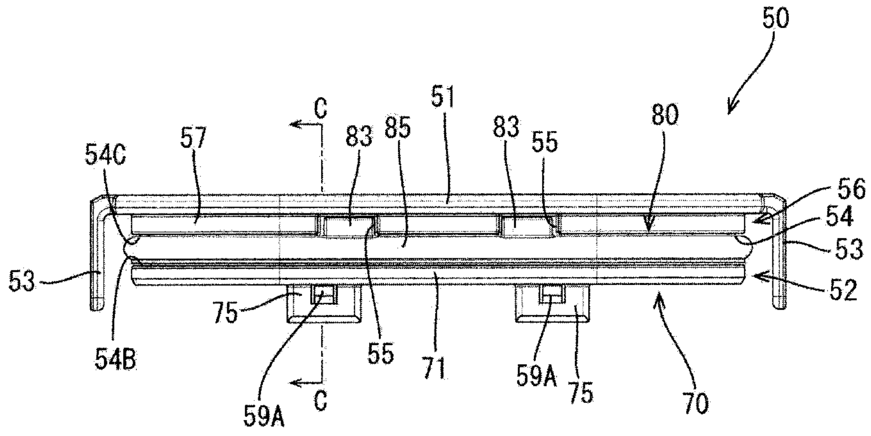
FIG. 5 is a plan view of the service cover.
Figure 6:
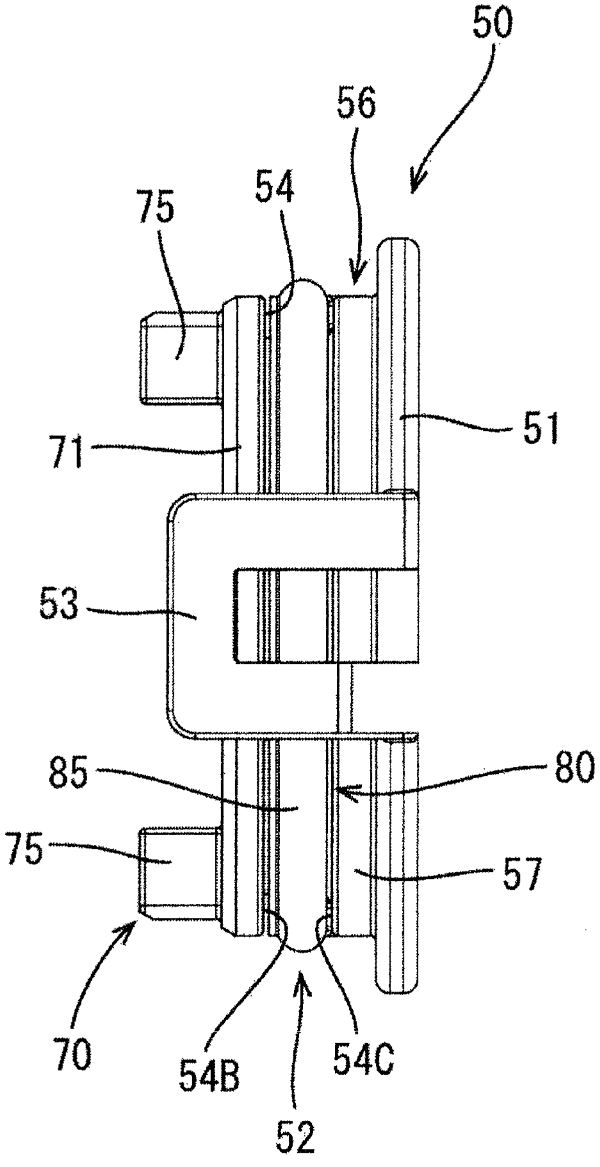
FIG. 6 is a side view of the service cover.
Figure 7:
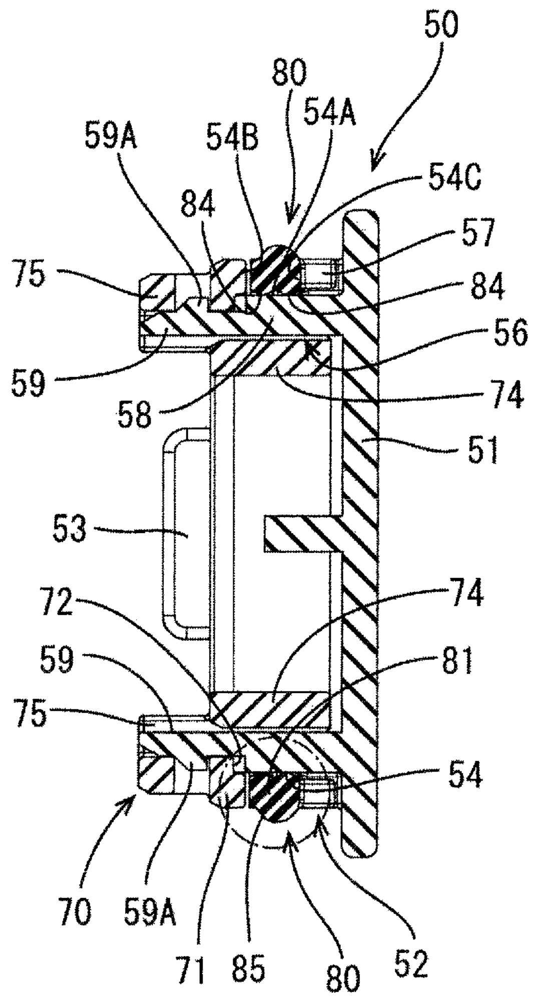
FIG. 7 is a section along C-C of FIG. 5.

The fitting 52 is a wide tube, as shown in FIGS. 3 to 5. A recess 54 is recessed on the outer peripheral surface of the fitting 52 to receive a seal ring 80. The recess 54 is recessed concavely from the outer peripheral surface of the fitting 52 toward an axial center of the fitting 52, as shown in FIGS. 2, 3 and 7. The recess 54 has a bottom wall 54A at a position slightly deeper than the outer peripheral surface of the fitting 52. The recess 54 also has a front inner wall 54B and a rear inner wall 54C that are raised toward a radially outer side at front and rear ends of the bottom wall 54A.

Figure 8:
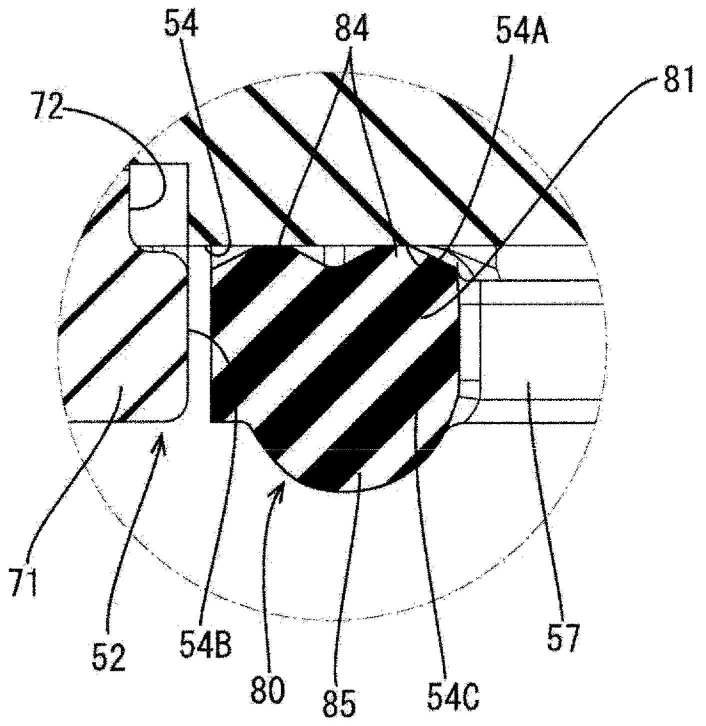
FIG. 8 is an enlarged section of an essential part of FIG. 7.

The seal ring 80 includes an annular seal main body 81 corresponding to the fitting 52 and having an elliptical shape when viewed from front. As shown in FIGS. 7 and 8, the seal main body 81 has a substantially rectangular cross-section and, when the seal ring 80 is fit into the fitting recess 54, the opposite front and rear end surfaces of the seal main body 81 face the front and rear inner walls 54B, 54C of the fitting recess 54 in the front-back direction. In this way, the seal ring 80 is locked by the front inner wall 54B from the front to prevent the seal ring 80 from coming off the fitting 52.

An outer peripheral lip 85 projects outwardly is formed over the entire circumference on the outer peripheral surface of the seal main body 81, as shown in FIG. 8. The outer peripheral lip 85 is provided eccentrically on a rear end part of the seal main body 81 and is adjacent to the rear end surface of the seal main body 81. The outer peripheral surface of a front end of the seal main body 81 is substantially flush with the outer peripheral surface of the fitting 52. Note that "substantially flush" also means a case where the height of the outer peripheral surface of the front end of the seal main body 81 is equal to or lower than that of the outer peripheral surface of the fitting 51. Two inner peripheral lips 84 project inward from the inner peripheral surface of the seal main body 81 and extend over the entire inner periphery of the seal main body 81 while being side by side in the front-back direction on the inner peripheral surface.

The service cover 50 is mounted by inserting the fitting 52 into the rear end opening 25, as shown in FIGS. 2 and 3. Thus, each inner peripheral lip 84 of the seal ring 80 closely contacts the bottom wall 54A of the fitting recess 54 over the entire periphery and the outer peripheral lip 85 closely contacts the inner peripheral surface of the rear end opening 25 over the entire periphery. In this way, water or the like cannot enter the housing main body 21 through a clearance between the inner peripheral surface of the rear end opening 25 and the fitting 52.

Positioning pieces 83 project back from the rear end surfaces of long side parts of the seal main body 81, as shown in FIG. 5. The positioning pieces 83 are fit respectively into positioning recesses 55 recessed on the rear inner wall 54C of the fitting recess 54. Engagement of the positioning pieces 83 in the corresponding positioning recesses 55 ensure that the seal ring 80 is mounted at a proper position in the fitting recess 54.

As shown in FIG. 2, is formed by assembling a lower shell 62 and an upper shell 61 with each other and is mounted on the housing main body 21.

The lower shell 62 is tubular and covers a lower part of the housing main body 21 over the entire periphery. An unillustrated braided wire collectively covers the wires 90 in the housing main body 21 and is caulked into connection with a lower part of the lower shell 62 by a caulk ring 63.

The upper shell 61 has a box shape and covers an upper part of the housing main body 21 from behind. The shield shell 60 is formed by assembling the upper shell 61 from behind after the lower shell 62 is assembled with the housing main body 21 from below.

The shield shell 60 is fixed to the housing main body 21 by a mounting screw S2 tightened into a lower part of the rear surface of the upper shell 61 from behind. Further, a fixing portion 64 extends forward on the front edge of the upper end of the upper shell 61. The fixing portion 64 is fixed to the case of the device by a fixing member (not shown), such as a bolt, to mount the waterproof connector 10 on the case.

The fitting 52 of the service cover 50 is formed by mounting a separate front member 70 on a tubular portion 56 integrally provided on the front surface of the lid body 51 as shown in FIGS. 2, 3 and 7.

The tubular portion 56 is wide and projects forward from the front end surface of the lid body 51, and a front part of the tubular portion 56 defines a cross-sectionally small portion 58 that is cross-sectionally smaller than a cross-sectionally large portion 57 on a rear end part of the tubular portion 56.

The tubular portion 56 has a cross-sectionally small portion toward the front side and is molded by a mold (not shown) that is opened in the front-back direction. Further, the cross-sectionally small portion 58 and the cross-sectionally large portion 57 are connected via a step that constitutes the rear inner wall 54C of the fitting recess 54 and an outer peripheral part of the cross-sectionally small portion 58 constitutes the bottom wall 54A of the fitting recess 54.

Two locking pieces 59 project forward on the front end surface of each long side of the cross-sectionally small portion 58, as shown in FIGS. 4, 5 and 7. Each locking piece 59 is resiliently displaceable inward of the cross-sectionally small portion 58 and a locking projection 59A projects out on the outer surface of each locking piece 59.

On the other hand, as shown in FIGS. 4 to 7, the front member 70 includes a plate-like retaining portion 71 to be mounted from the front on a front end part of the cross-sectionally small portion 58. The retaining portion 71 has an elliptical ring shape corresponding to the opening edge of the cross-sectionally small portion 58 when viewed from the front. A fitting groove 72 is provided on the rear surface of the retaining portion 71 and a front end part of the cross-sectionally small portion 58 is fit lightly therein from behind.

As shown in FIGS. 7 and 8, when the front part of the cross-sectionally small portion 58 is fit into the fitting groove 72 of the retaining portion 71, a part of the retaining portion 71 radially outward of the fitting groove 72 is arranged before the step of the tubular portion 56 between the cross-sectionally small portion 58 and the cross-sectionally large portion 57 to constitute the front inner wall 54B of the fitting recess 54.

In other words, the retaining portion 71 has a larger cross-section than the cross-sectionally small portion 58 and an outer peripheral edge of the retaining portion 71 constitutes the front inner wall 54B of the fitting recess 54. Specifically, when the front member 70 is mounted on the tubular portion 56, the fitting recess 54 is formed on the outer peripheral surface of the fitting 52 by the outer peripheral part of the cross-sectionally small portion 58 (bottom wall 54A of the fitting recess 54), the step of the tubular portion 56 between the cross-sectionally small portion 58 and the cross-sectionally large portion 57 (rear inner wall 54C of the fitting recess 54) and the part of the retaining portion 71 radially outward of the fitting groove 72 (front inner wall 54B of the fitting recess 54).

An inner tube 73 is provided on an inner periphery of the retaining portion 71 radially inward of the fitting groove 72 and extends back from the rear surface of the retaining portion 71, as shown in FIG. 2. The inner tube 73 can fit tightly to the inner peripheral surface of the tubular portion 56. Accordingly, when the front member 70 is mounted on the tubular portion 56, the inner tube 73 fits tightly to the inner peripheral surface of the tubular portion 56 and the tubular portion 56 is reinforced from an inner side by the inner tube 73 to form the fitting 52.

Guides 74 are provided at positions of the long sides of the front member 70 at positions to receive the locking pieces 59 of the cross-sectionally small portion 58, as shown in FIG. 4. Each guide portion 74 is formed at parts of the retaining portion 71 and the inner tube 73 corresponding to the locking piece 59 to be thick at a radially inner side and by making inner parts of these thick parts hollow in the front-back direction, as shown in FIG. 7.

The locking pieces 59 are displaced radially inward and enter the guides 74 from behind when the front member 70 is assembled with the tubular portion 56. The guides 74 guide the locking pieces 59 to proper positions. The locking projections 59A of the locking pieces 59 and the front surface of the retaining portion 71 are locked to each other in the front-back direction when front ends of the locking pieces 59 are passed through the guides 74. Thus, the front member 70 is fixed in a state positioned with respect to the tubular portion 56.

A protection wall 75 is formed on an opening edge of the front end of the guide 74, as shown in FIGS. 4 to 7. The protection wall 75 is formed into a box shape that is open forward and toward a radially inner side of the retaining portion 71. The protection wall 75 covers the locking piece 59 that projects forward from the guide 74 from an outer side to prevent breakage of the locking piece 59 and unlocking of the locking projection 59A of the locking piece 59 from the retaining portion 71 due to contact of another member with the locking piece 59.

The housing 20 with two female terminals 40 accommodated in the terminal accommodating portion 24 is prepared and the L-shaped terminals 42 of the braided conductors 41 connected to the female terminals 40 are arranged on the rear surfaces of the terminal fixing bases 28 of the housing main body 21.

The wires 90 connected to the intermediate terminals 91 then are introduced into the respective accommodating chambers 27 from below the housing main body 21, and the intermediate terminals 91 are placed on the rear surfaces of the L-shaped terminals 42 arranged on the terminal fixing bases 28.

The fixing screws S1 then are inserted into the accommodating chambers 27 through the rear end opening 25 of the housing main body 21 and are inserted through the L-shaped terminals 42 and the intermediate terminals 91. Subsequently, a tool (not shown) is inserted into the accommodating chamber 27 through the rear end opening 25 to tighten the fixing screw S1 into the terminal fixing base 28. In this way, the L-shaped terminal 42 and the intermediate terminal 91 are fixed to the housing main body 21 and the L-shaped terminal 42 and the intermediate terminal 91 are connected electrically.

Subsequently, the service cover 50 is mounted over the rear end opening 25 of the housing main body 21 to close the rear end opening 25, thereby forming the service cover 50 in advance.

The service cover 50 is formed by mounting the seal ring 80 on the cross-sectionally small portion 58 before the front member 70 is mounted. The tubular portion 56 has a smaller cross-section toward the front from the large diameter portion 57 to the small diameter portion 58. Thus, the seal ring 80 can be fit easily onto the outer peripheral surface of the small diameter portion 58 from the front. Further, the positioning pieces 83 of the seal ring 80 fit into the positioning recesses 55. Thus, the seal ring 80 can be fit while being positioned at a proper position with respect to the cross-sectionally small portion 58.

Further, when the seal ring 80 is arranged at the proper position with respect to the small diameter portion 58 in the front-back direction, the rear end surface of the seal ring 80 contacts the stepped part between the small diameter portion 58 and the large diameter portion 57 (rear inner wall 54C of the fitting recess 54) to prevent the seal ring 80 from moving farther back.

The front member 70 is assembled with the front end of the small diameter portion 58 after the seal ring 80 is stopped and arranged at the proper position with respect to the small diameter portion 58.

The locking pieces 59 of the cross-sectionally small portion 58 are inserted into the corresponding guides 74 on the retaining portion 71 of the front member 70 from behind when assembling the front member 70 with the cross-sectionally small portion 58. The locking pieces 59 are guided by the guides 74 and front end parts of the locking pieces 59 are passed through the guides 74. The locking projections 59A of the locking pieces 59 and the front surface of the retaining portion 71 then are locked to each other in the front-back direction so that the front member 70 is fixed while being positioned with respect to the tubular portion 56, as shown in FIG. 7.

The protection walls 75 are arranged at outer sides of the locking pieces 59 locked to the front surface of the retaining portion 71. Thus, the locking pieces 59 are not likely to be broken and the locking projections 59A of the locking pieces 59 are not likely to be unlocked from the retaining portion 71 by contact of another member with the locking pieces 59. Thus, the front member 70 will not be detached from the tubular portion 56.

The front part of the small diameter portion 58 is fit lightly into the fitting groove 72 of the retaining portion 71 from behind when the front member 70 is fixed with respect to the tubular portion 56 and the inner tube 73 of the front member 70 is fit to the inner peripheral surface of the tubular portion 56, as shown in FIG. 2. In this way, the tubular portion 56 is reinforced from the inner side by the inner tube 73 to form the fitting 52.

When the fitting 52 is formed, the part of the retaining portion 71 radially outward of the fitting groove 72 is arranged before the step of the tubular portion 56 between the cross-sectionally small portion 58 and the cross-sectionally large portion 57. Additionally, the fitting recess 54 for the seal ring 80 is formed on the outer peripheral surface of the fitting 52 by the part of the retaining portion 71 radially outward of the fitting groove 72 (front inner wall 54B of the fitting recess 54), the cross-sectionally small portion 58 (bottom wall 54A of the fitting recess 54) and the step of the tubular portion 56 between the cross-sectionally small portion 58 and the cross-sectionally large portion 57 (rear inner wall 54C of the fitting recess 54).

A fitting recess that is molded simultaneously with a fitting portion by a mold that is opened in a radial direction has a parting line of the mold crossing the fitting recess and sealing performance of a seal ring tends to be reduced by burrs along the parting line. Further, processing work for removal of burrs is necessary to ensure sealing performance of the seal ring in the fitting recess.

However, in this embodiment, the fitting recess 54 is formed by molding the tubular portion 56 using a mold that is opened in a fitting direction and mounting the front member 70 on the front of the small diameter portion 58. This can prevent a parting line from being formed on the fitting recess 54 into which the seal ring 80 is fit and ensures sealing performance of the seal ring 80.

The service cover 50 is formed in advance, and the fitting 52 of the service cover 50 then is fit to close the rear end opening 25 after the fixing screws S1 have been tightened. Further, each inner peripheral lip 84 of the seal ring 80 closely contacts the bottom wall 54A of the fitting recess 54 over the entire periphery and the outer peripheral lip 85 closely contacts the inner peripheral surface of the rear end opening 25 over the entire periphery when the rear end opening 25 is closed, as shown in FIGS. 2 and 3. In this way, water or the like cannot enter into the housing main body 21 through a clearance between the inner peripheral surface of the rear end opening 25 and the fitting 52.

The shield shell 60 then is formed by assembling the lower shell 62 with the housing main body 21 from below and assembling the upper shell 61 from behind. The shield shell 60 then is fixed to the housing main body 21 to complete the waterproof connector 10 by tightening the mounting screw S2 into the lower part of the rear surface of the upper shell 61 from behind.

As described above, the service cover 50 has the fitting recess 54 formed by molding the tubular portion 56 using the mold that is opened in the front-back direction and mounting the front member 70 on the front part of the cross-sectionally small portion 58 of the tubular portion 56. Thus, sealing performance of the seal ring 80 is ensured by preventing a parting line from being formed on the fitting recess 54 into which the seal ring 80 is to be fit.

The front member 70 can be fixed to the tubular portion 56 by locking the retaining portion 71 constituting the front inner wall 54B of the fitting recess 54 and the locking pieces 59 of the cross-sectionally small portion 58 to each other in the front-back direction. Thus, a length of the front member 70 in the front-back direction is reduced, as compared with the case where locks to be locked to locking pieces of a cross-sectionally small portion in the front-back direction are provided separately before and after a retaining portion.

Further, the locking pieces 59 of the cross-sectionally small portion 58 are guided by the guides 74 and the locking projections 59A of the locking pieces 59 and the front surface of the retaining portion 71 can be locked to each other in the front-back direction. Thus, the front member 70 can be fixed while being positioned with respect to the tubular portion 56.

Furthermore, the protection walls 75 are on the outer peripheries of the locking pieces 59 locked to the retaining portion 71. Thus, the locking pieces 59 are not likely to be broken and the locking projections 59A of the locking pieces 59 are not likely to be separated the retaining portion 71 due to the contact of another member. In this way, the detachment of the front member 70 from the tubular portion 56 can be prevented.

The invention is not limited to the above described embodiment, and the following embodiments also are included in the scope of the invention.

The service cover is mounted over the rear end opening of the housing main body in the above embodiment. However, a service cover may be mounted over an opening provided on a case of a device.

The service cover 50 has a wide elliptical shape in the above embodiment. However, the service cover may be substantially polygonal.

The locking pieces 59 are formed on the cross sectionally small portion 58 of the tubular portion 56 and the front member 70 is fixed to the tubular portion 56 by locking the locking pieces 59 and the retaining portion 71 of the front member 70 to each other in the above embodiment. However, the locking pieces may be formed on the front member and the front member may be fixed to the tubular portion by locking the locking pieces and the tubular portion together.

REFERENCE SIGNS

10: connector
20: housing (case body)
21: housing main body (case body)
25: rear end opening
50: service cover
52: fitting
54: fitting recess
58: cross sectionally small portion
59: locking piece
70: front member
71: retaining portion
74: guide portion
75: protection wall
80: seal ring (seal member)

What is claimed is:

1. A service cover to be mounted to close an opening on a case body, comprising:

a lid body dimensioned to fit externally of the opening on the case body;

a fitting that is fittable into the opening, the fitting including a cross-sectionally large portion adjacent the lid body and a cross-sectionally small portion adjacent the cross-sectionally large portion;

a seal providing fluidtightness between the opening and the fitting, the seal being mounted on the cross-sectionally small portion and adjacent the cross-sectionally large portion; and a cross-sectionally large front member mounted on the cross-sectionally small portion of the fitting so that the cross-sectionally large front member abuts a surface of the seal opposite the cross-sectionally large portion of the fitting.

2. A service cover to be mounted to close an opening on a case body, comprising:

a fitting that is fittable into the opening;

a seal providing fluidtightness between the opening and the fitting; and a fitting recess recessed on an outer peripheral surface of the fitting and in which the seal is fit, wherein the fitting recess is formed by mounting a cross-sectionally large front member on a cross-sectionally small portion of the fitting in a fitting direction on the cross-sectionally small portion, and the front member includes at least one retaining portion forming part of a front wall of the fitting recess by having the small diameter portion fit therein and configured to lock at least one locking piece extending forward from the cross-sectionally small portion in a front-back direction.

3. The service cover of claim 2, wherein the retaining portion includes at least one guide that guides and positions the locking piece.

4. The service cover of claim 2, wherein the locking piece is resiliently displaceable toward a radially inner side of the cross-sectionally small portion.

5. The service cover of claim 2, further comprising at least one protection wall formed on a front surface of the retaining portion for at least partly covering an outer side of the locking piece.

6. A connector assembly comprising a connector and the service cover of claim 1 mounted to close the opening on the case body of the connector.

* * * * *